(12) United States Patent
Kim et al.

(10) Patent No.: US 10,811,463 B2
(45) Date of Patent: Oct. 20, 2020

(54) LIGHT EMITTING DISPLAY DEVICE

(71) Applicant: SAMSUNG DISPLAY CO., LTD., Yongin-si, Gyeonggi-do (KR)

(72) Inventors: Hyo Yeon Kim, Yongin-si (KR); Yi Seul Kim, Yongin-si (KR); Heun Seung Lee, Yongin-si (KR); Ji Hwan Yoon, Yongin-si (KR); Jae Hoon Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 59 days.

(21) Appl. No.: 15/791,513

(22) Filed: Oct. 24, 2017

(65) Prior Publication Data

US 2018/0261652 A1 Sep. 13, 2018

(30) Foreign Application Priority Data

Mar. 8, 2017 (KR) ........................ 10-2017-0029514

(51) Int. Cl.
*H01L 27/30* (2006.01)
*H01L 51/00* (2006.01)
(Continued)

(52) U.S. Cl.
CPC .......... *H01L 27/305* (2013.01); *H01L 27/322* (2013.01); *H01L 27/3211* (2013.01);
(Continued)

(58) Field of Classification Search
CPC .............. H01L 27/305; H01L 51/0047; H01L 51/0036; H01L 27/322; H01L 27/3211;
(Continued)

(56) References Cited

U.S. PATENT DOCUMENTS 9,401,460 B2 7/2016 Fujita et al.
2010/0133434 A1 6/2010 Meng et al.
(Continued)

FOREIGN PATENT DOCUMENTS

KR 10-0552964 B1 2/2006
KR 10-2006-0079225 A 7/2006
(Continued)

OTHER PUBLICATIONS

Extended European Search Report dated Jun. 6, 2018, of the corresponding European Patent Application No. 17208459.2.

*Primary Examiner* — Marcos D. Pizarro
*Assistant Examiner* — Sue Tang
(74) *Attorney, Agent, or Firm* — Lewis Roca Rothgerber Christie LLP

(57) ABSTRACT

A light emitting display device includes a substrate that includes a first pixel, a second pixel, a third pixel, and an infrared ray emission portion, the first pixel, the second pixel, and the third pixel representing different colors, a first electrode on the substrate, a second electrode that overlaps the first electrode, an emission layer between the first electrode and the second electrode, and an auxiliary layer between the first electrode and the emission layer. The emission layer may include a first emission layer in the first pixel and an infrared ray emission layer in the infrared ray emission portion, the auxiliary layer may include a first auxiliary layer in the first pixel, and the infrared ray emission layer and the first auxiliary layer may include the same material.

23 Claims, 13 Drawing Sheets

(51) Int. Cl.
*H01L 51/50* (2006.01)
*H01L 27/32* (2006.01)
*H01L 51/42* (2006.01)

(52) U.S. Cl.
CPC ........ *H01L 27/3213* (2013.01); *H01L 51/008* (2013.01); *H01L 51/0036* (2013.01); *H01L 51/0047* (2013.01); *H01L 51/0078* (2013.01); *H01L 51/0089* (2013.01); *H01L 51/4253* (2013.01); *H01L 51/504* (2013.01)

(58) Field of Classification Search
CPC ............ H01L 51/4253; H01L 27/3213; H01L 51/504; H01L 51/0089; H01L 51/008; H01L 51/0078
See application file for complete search history.

(56) References Cited

U.S. PATENT DOCUMENTS

| | | | |
|---|---|---|---|
| 2014/0034911 A1* | 2/2014 | Liu | H01L 51/0078 257/40 |
| 2014/0091287 A1* | 4/2014 | Sago | H01L 27/3211 257/40 |
| 2015/0179726 A1 | 6/2015 | Liu et al. | |
| 2015/0243712 A1* | 8/2015 | Wang | H01L 27/3227 257/40 |
| 2018/0261655 A1* | 9/2018 | Lee | H01L 27/3269 |

FOREIGN PATENT DOCUMENTS

| | | |
|---|---|---|
| KR | 10-2011-0060494 A | 6/2011 |
| KR | 10-2015-0101509 A | 9/2015 |

\* cited by examiner

LIGHT EMITTING DISPLAY DEVICE

CROSS-REFERENCE TO RELATED APPLICATION

Korean Patent Application No. 10-2017-0029514, filed on Mar. 8, 2017, in the Korean Intellectual Property Office, and entitled: "Light Emitting Display Device," is incorporated by reference herein in its entirety.

BACKGROUND

1. Field

The present disclosure relates to a light emitting display device.

2. Description of the Related Art

A light emitting element may be an element that emits light when an exciton formed by coupling electrons, injected from an anode, and holes, injected from a cathode, with each other in an organic emission layer is stabilized.

Such a light emitting element may provide various merits such as a wide viewing angle, a high response speed, a slim thickness, and low power consumption, and thus may be applied to various electric and electronic devices such as a television, a monitor, a mobile phone, and the like.

The above information disclosed in this Background section is only for enhancement of understanding of the background of the invention and therefore it may contain information that does not form the prior art that is already known in this country to a person of ordinary skill in the art.

SUMMARY

Embodiments are directed to a light emitting display device, including a substrate that includes a first pixel, a second pixel, a third pixel, and an infrared ray emission portion, the first pixel, the second pixel, and the third pixel representing different colors, a first electrode on the substrate, a second electrode that overlaps the first electrode, an emission layer between the first electrode and the second electrode, and an auxiliary layer between the first electrode and the emission layer. The emission layer may include a first emission layer in the first pixel and an infrared ray emission layer in the infrared ray emission portion, the auxiliary layer may include a first auxiliary layer in the first pixel, and the infrared ray emission layer and the first auxiliary layer may include the same material.

The infrared ray emission layer and the first auxiliary layer may be disposed in the same layer.

The first emission layer may be provided on the first auxiliary layer.

In the infrared ray emission layer and the first auxiliary layer, an infrared ray emission dopant may be doped to a first pixel emission material or a resonance auxiliary layer material.

The infrared ray emission dopant may include one or more of a metal complex compound, a donor-acceptor-donor compound, or a lanthanide compound.

A metal included in the metal complex compound may include Pt, Pd, Cu, or Zn.

The metal complex compound may include a compound represented by Chemical Formula 1,

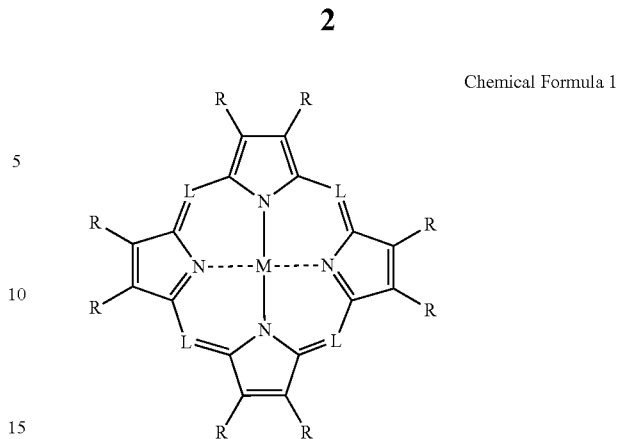

Chemical Formula 1

In Chemical Formula 1, L may be N or CR' where R' may be a phenyl group, a tolyl group, a xylenyl group, a mesityl group, a methyl group, an ethyl group, an n-propyl group, or an isopropyl group, M may be Pt, Pd, Cu, Zn, Sc, Y, La, Ti, Zr, Hf, V, Nb, Ta, Cr, Mo, W, Mn, Tc, Re, Fe, Ru, Os, Co, Rh, Ir, Ni, Ag, Au, Cd, Hg, Al, Ga, In, Tl, Si, Ge, Sn, Pb, P, As, Sb, Bi, S, Se, Te, Po, Cl, Br, I, At, a lanthanide, or an actinide, and each R may independently be Cl, Br, I, At, or a group that includes an atom coupled to a beta ($\beta$) carbon of a pyrrole ring, wherein the atom coupled to the beta ($\beta$) carbon is B, C, N, O, Si, P, S, Cl, Ge, As, Se, Br, In, Sn, Sb, Te, I, Tl, Pb, Bi, Po, or At, and two adjacent R groups coupled to the same pyrrole ring optionally form a carbocyclic group or a heterocyclic group together with two $\beta$ carbons.

The infrared ray emission dopant may have a wavelength range of 700 nanometers to 1000 nanometers.

The light emitting display device may further include a second auxiliary layer between the first electrode and the first auxiliary layer, and a third auxiliary layer between the first electrode and the infrared ray emission layer. The second auxiliary layer and the third auxiliary layer may include the same material.

The second auxiliary layer and the third auxiliary layer may be disposed in the same layer.

The second auxiliary layer and the third auxiliary layer may include the same resonance auxiliary layer material.

The second auxiliary layer may be thicker than the first auxiliary layer.

In the infrared ray emission layer and the first auxiliary layer, an infrared ray emission dopant may be doped to a first pixel emission material or a resonance auxiliary layer material.

The emission layer may further include a second emission layer in the second pixel, the auxiliary layer may further include a fourth auxiliary layer in the second pixel, a fifth auxiliary layer in the first pixel, and a sixth auxiliary layer in the infrared ray emission portion, and the fourth auxiliary layer, the fifth auxiliary layer, and the sixth auxiliary layer may include the same material.

The fourth auxiliary layer, the fifth auxiliary layer, and the sixth auxiliary layer may be in the same layer.

In the infrared ray emission layer and the first auxiliary layer, an infrared ray emission dopant may be doped to an infrared ray emission host.

The infrared ray emission dopant may include one or more of a metal complex compound, a donor-acceptor-donor compound, or a lanthanide compound.

A metal included in the metal complex compound may include Pt, Pd, Cu, or Zn.

The first pixel, the second pixel, and the third pixel may respectively correspond to a red pixel, a green pixel, and a blue pixel, and the first auxiliary layer of the first pixel may be disposed in the same layer as the infrared ray emission layer.

The light emitting display device may further include an intermediate layer between the first emission layer and the first auxiliary layer.

A HOMO energy level of the intermediate layer may be between a HOMO energy level of the first auxiliary layer and a HOMO energy level of the first emission layer.

The HOMO energy level of the intermediate layer may be lower than that of the first auxiliary layer.

A gap between a HOMO energy level of the first auxiliary layer and a HOMO energy level of an infrared ray emission dopant may be 0.3 eV or less.

BRIEF DESCRIPTION OF THE DRAWINGS

Features will become apparent to those of skill in the art by describing in detail example embodiments with reference to the attached drawings in which.

DETAILED DESCRIPTION

Figure 1:
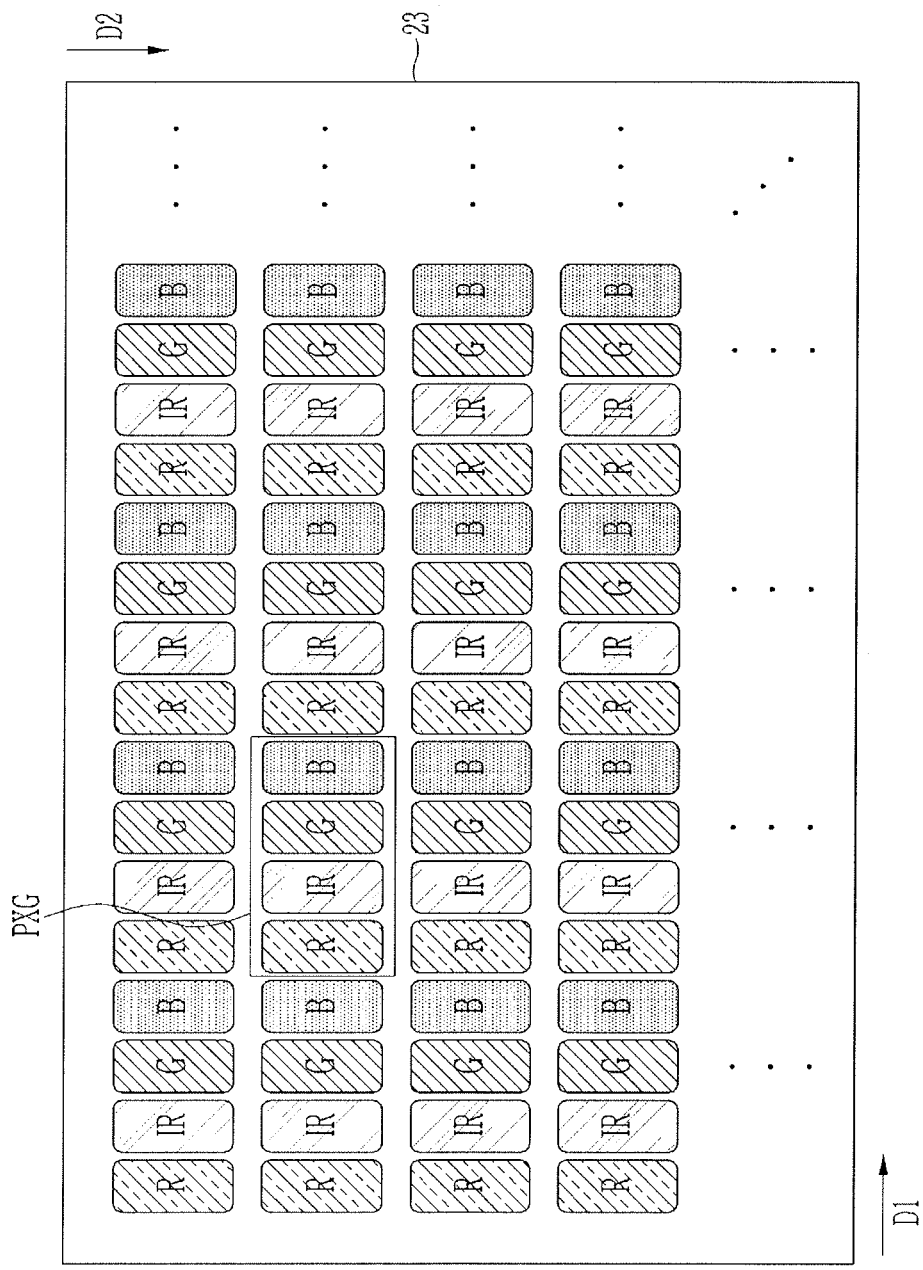
FIG. 1 illustrates a top plan view of a layout of a plurality of pixels and infrared ray emission portions according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" means positioning on or below the object portion, but does not essentially mean positioning on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

In this specification, the phrase "on a plane" means viewing a target portion from the top, and the phrase "on a cross-section" means viewing a cross-section formed by vertically cutting a target portion from the side.

FIG. 1 illustrates a top plan view of a layout of a plurality of pixels and infrared ray emission portions according to an example embodiment.

Referring to FIG. 1, a substrate 23 of a light emitting display device according to an example embodiment includes first pixels R, second pixels G, and third pixels B respectively representing different colors, and infrared ray emission portions IR. In a plan view, the first pixel R, the infrared ray emission portion IS, the second pixel G, and the third pixel B may be alternately arranged along a first direction, and the same pixels or the infrared ray emission portions IR may be arranged along a second direction D2 that crosses the first direction D2. In this case, the infrared ray emission portion IR is disposed between the first pixel R and the second pixel G, but this is not restrictive. The infrared ray emission portion IR may be disposed, for example, between the first pixel R and the third pixel B or between the second pixel G and the third pixel B.

The pixels R, G, and B may be points which are minimum units for representing brightness and darkness, and the infrared ray emission portion IR may indicate an area that emits infrared rays of, for example, about 700 nanometers to about 1000 nanometers so as to serve as, for example, an illumination sensor, a proximity sensor, a finger identification sensor, an iris identification sensor, or a vein sensor. In FIG. 1, the first pixel R, the infrared ray emission portion IR, the second pixel G, and the third pixel B may form one pixel group PXG, and a plurality of pixel groups PXG may be vertically and horizontally arranged along the first direction D1 and the second direction D2 on the substrate 23.

In FIG. 1, pixel groups PXG formed of the first pixel G, the infrared ray emission portion IR, the second pixel R, and the third pixel B are iteratively arranged, but the infrared ray emission portion IR may be included in some of the pixel groups PXG rather than being included in all the pixel groups PXG. For example, a first pixel group formed of the first pixel R, the second pixel G, and the third pixel B and a second pixel group PXG formed of the first pixel R, the infrared ray emission portion IR, the second pixel G, and the third pixel B may be alternately arranged along the first direction D1, or the second pixel group PXG may be arranged for every two first pixel groups. However, embodiments are not limited thereto, and a plurality of pixel groups may be arranged on the substrate 23 by using various methods. In this case, the pixel groups may be arranged with regularity for accuracy in sensing.

Figure 2:
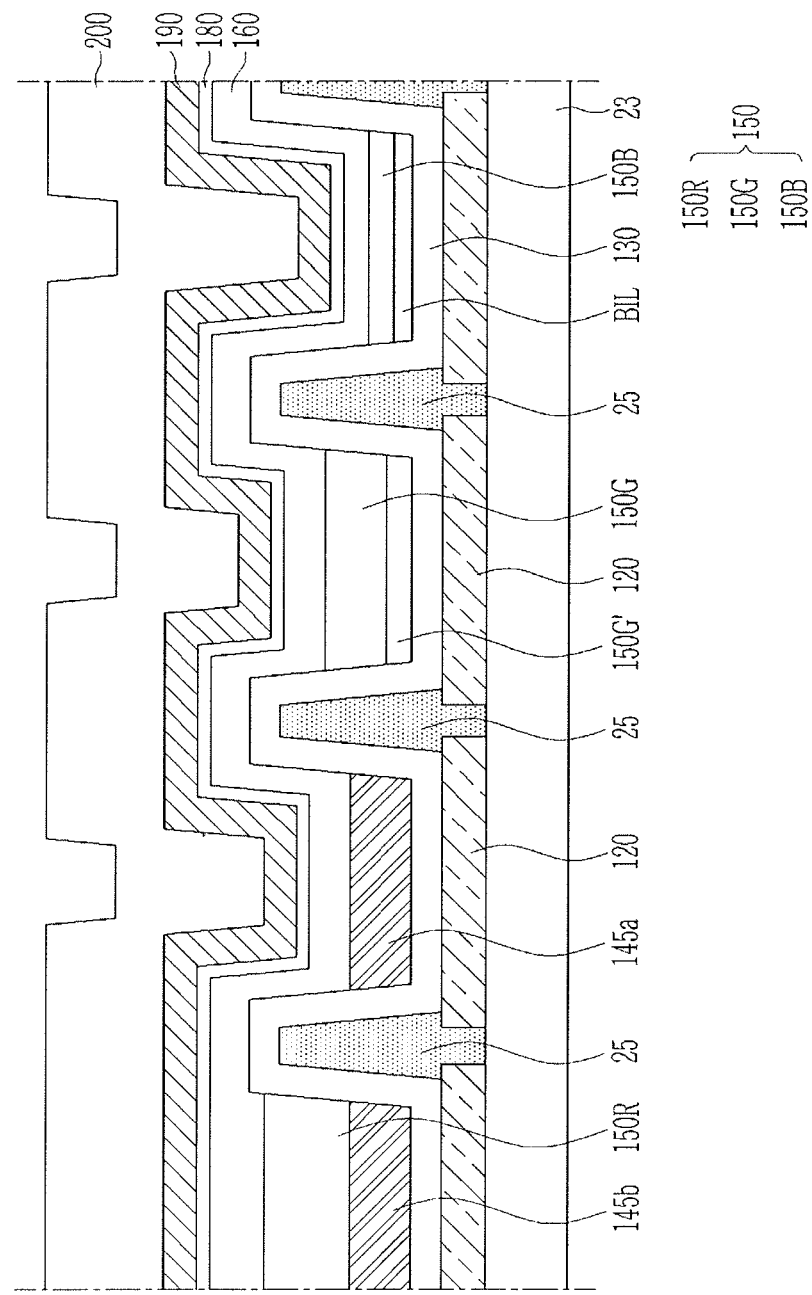
FIG. 2 illustrates a cross-sectional structure of the pixel group of FIG. 1.

FIG. 2 shows a cross-sectional structure of the pixel group shown in FIG. 1. Light emitting elements that respectively correspond to the first pixel R, the infrared ray emission portion IR, the second pixel G, and the third pixel B described with reference to FIG. 1 are shown on the substrate 23 of FIG. 2.

Referring to FIG. 2, the light emitting display device according to the present example embodiment includes a first electrode 120 on the substrate 23, a second electrode 190 that overlaps the first electrode 120, an emission layer 150 that is disposed between the first electrode 120 and the second electrode 190, a hole transport layer 130 that is disposed between the first electrode 120 and the emission layer 150, an electron transport layer 160 that is disposed between the emission layer 150 and the second electrode 190, an electron injection layer 180 that is disposed between the electron transport layer 160 and the second electrode 190, and a capping layer 200 that is disposed on the second electrode 190.

In the present example embodiment, the first electrode 120 may be a reflective electrode. In this case, the reflective electrode may be defined as an electrode that includes a material having a light reflective property for transmission of light emitted from the emission layer 150 to the second electrode 190. Here, the light reflective property may imply that reflectance with respect to incident light is more than about 70% or less than about 100%, or more than about 80% or less than about 100%.

The first electrode 120 may include, for example, silver (Ag), aluminum (Al), chromium (Cr), molybdenum (Mo), tungsten (W), titanium (Ti), gold (Au), palladium (Pd), or an alloy thereof, and may have, for example, a three-layer structure of silver (Ag)/indium tin oxide (ITO)/silver (Ag) or a three-layer structure of indium tin oxide (ITO)/silver (Ag)/indium tin oxide (ITO).

The first electrode 120 may be formed by using, for example, a sputtering method, a vapor phase deposition method, an ion beam deposition method, or an electron beam deposition method.

The hole transport layer 130 may correspond to an auxiliary layer that is disposed between the first electrode 120 and the emission layer 150. The hole transport layer 130 may include one or more of a hole injection layer (HIL) or a hole transport layer (HTL). The hole injection layer (HIL) may ease injection of holes from the first electrode 120, and the hole transport layer (HTL) may ease transport of holes transmitted from the hole injection layer. The hole transport layer 130 may have, for example, a double layer structure in which the hole transport layer is disposed on the hole injection layer, or may be provided as a single layer formed by a mixture of a material that forms the hole injection layer and a material that forms the hole transport layer.

The hole transport layer 130 may include an organic material. For example, the hole transport layer 130 may include NPD (N,N-dinaphthyl-N,N'-diphenyl benzidine), TPD (N,N'-bis-(3-methylphenyl)-N,N'-bis-(phenyl)-benzidine), s-TAD, MTDATA (4,4',4''-tris(N-3-methylphenyl-N-phenyl-amino)-triphenylamine), or the like, but this is not restrictive.

The emission layer 150 may be disposed on the hole transport layer 130. The emission layer 150 may include a light emitting material that represents a specific color. For example, the emission layer 150 may display a primary color such as blue, green, or red, or a combination of the primary colors.

The emission layer 150 may have a thickness of for example, about 10 nm to about 50 nm. The emission layer 150 may include, for example, a host and a dopant. For example, in an embodiment, the emission layer 150 includes a red emission layer 150R, a green emission layer 150G, and a blue emission layer 150B, and they are arranged in a direction that is parallel with an upper surface of the first electrode 120.

In the present example embodiment, an infrared ray emission layer 145a is disposed in an area that corresponds to the infrared ray emission portion IR of FIG. 1. In the present example embodiment, the infrared ray emission layer 145a may be formed by doping an infrared ray emitting dopant to a first pixel light emitting material or a resonance auxiliary layer material. The first pixel light emitting material may be a material included in a red emission layer 150R, and the resonance auxiliary layer material may be a material included in the hole transport layer 130.

The infrared ray emitting dopant included in the infrared ray emission layer 145a may have a wavelength range of, for example, about 700 nanometers to about 1000 nanometers. For example, the wavelength range of the infrared ray emitting dopant may be about 850 nanometers to about 950 nanometers. In order to have such a wavelength range, the infrared ray emitting dopant according to the present example embodiment may include one or more of a metal complex compound, a donor-acceptor-donor (DAD) compound, or a lanthanide compound.

In the present example embodiment, the metal complex compound may include Pt, Pd, Cu, or Zn. The metal complex compound according to the present example embodiment may be a compound represented by Chemical Formula 1.

Chemical Formula 1

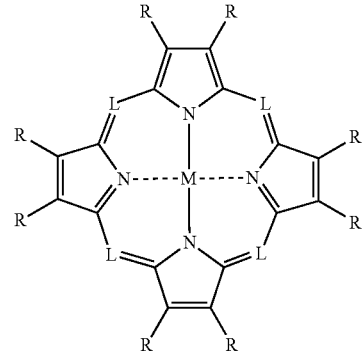

In Chemical Formula 1,

L may be N or CR', and M may be Pt, Pd, Cu, Zn, Sc, Y, La, Ti, Zr, Hf, V, Nb, Ta, Cr, Mo, W, Mn, Tc, Re, Fe, Ru, Os, Co, Rh, Ir, Ni, Ag, Au, Cd, Hg, Al, Ga, In, Tl, Si, Ge, Sn, Pb, P, As, Sb, Bi, S, Se, Te, Po, Cl, Br, I, At, a lanthanide, or an actinide, each R may independently be selected from:

A (Cl),

B (Br),

C (I),

D (At), and

E (a group including an atom coupled to a beta (β) carbon of a pyrrole ring), wherein the atom coupled to the beta (β) carbon is selected from B, C, N, O, Si, P, S, Cl, Ge, As, Se, Br, In, Sn, Sb, Te, I, Tl, Pb, Bi, Po, and At, and two adjacent R groups coupled to the same pyrrole ring may form a carbocyclic group or a heterocyclic group together with two β carbons of the pyrrole ring.

In CR'. R' may be a phenyl group, a tolyl group, a xylenyl group, a mesityl group, a methyl group, an ethyl group, an n-propyl group, or an isopropyl group.

The metal complex compound represented by Equation 1 may be any one of Chemical Formula 1-1 to Chemical Formula 1-10, below, but this is not restrictive. The metal complex compound is not limited to the stated type of metal complex compound. Chemical Formula 1-1 may be Pt(TPBP) (Pt-tetraphenyltetrabenzoporphyrin).

Chemical Formula 1-1

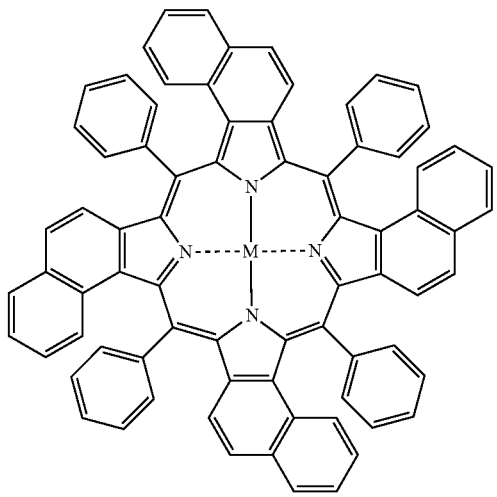

Chemical Formula 1-2

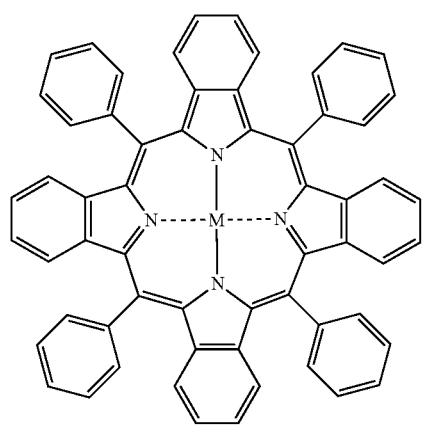

Chemical Formula 1-3

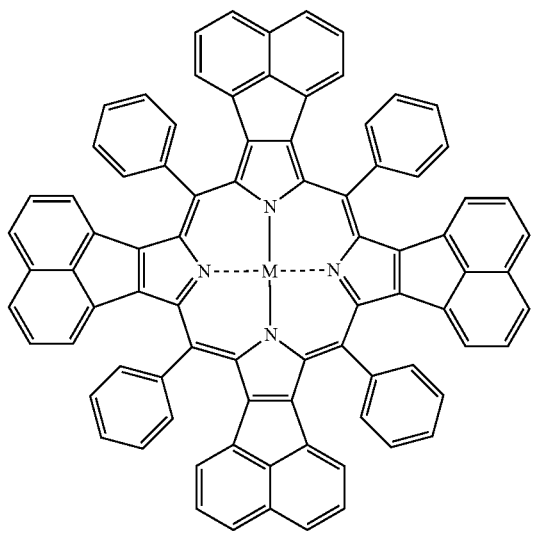

Chemical Formula 1-4

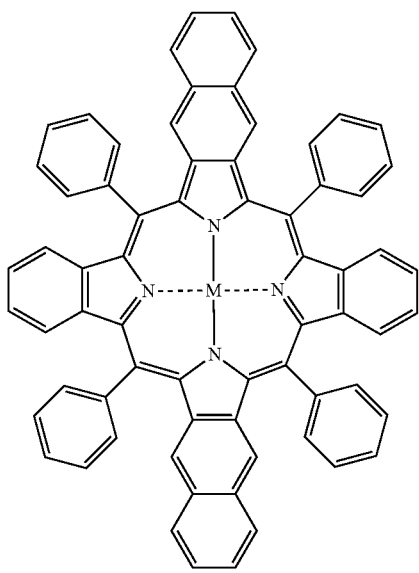

Chemical Formula 1-5

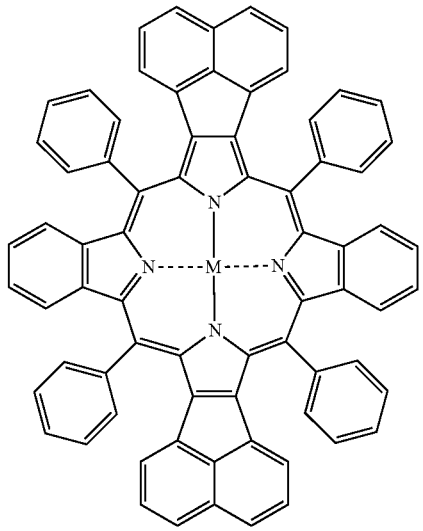

Chemical Formula 1-6

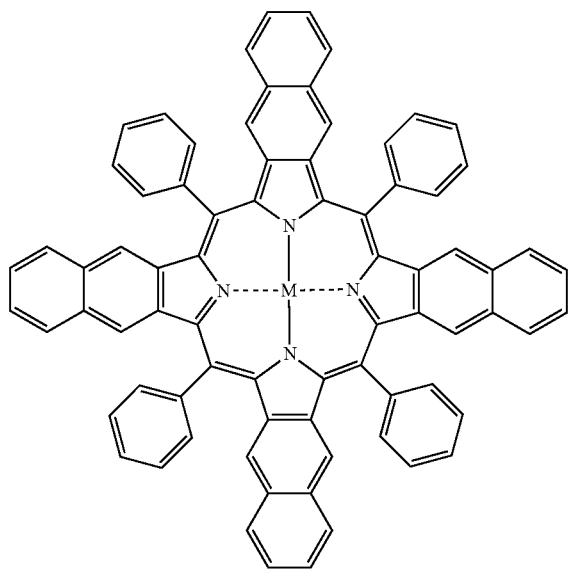

Chemical Formula 1-7

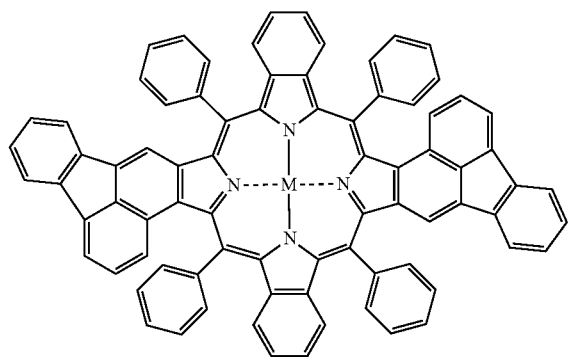

Chemical Formula 1-8

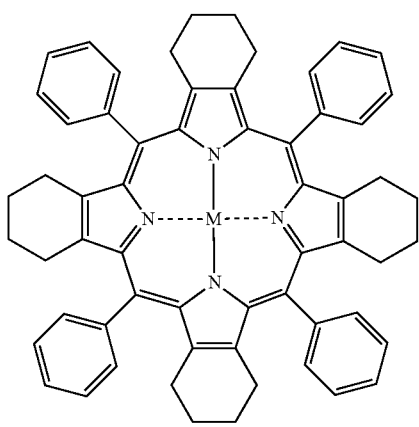

Chemical Formula 1-9

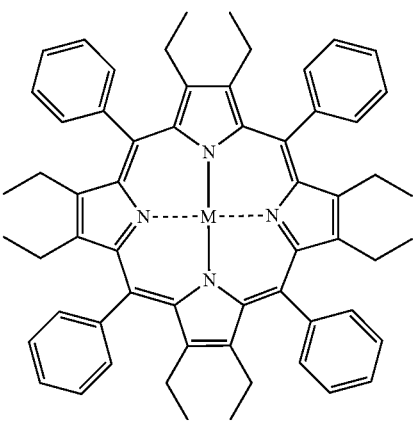

Chemical Formula 1-10

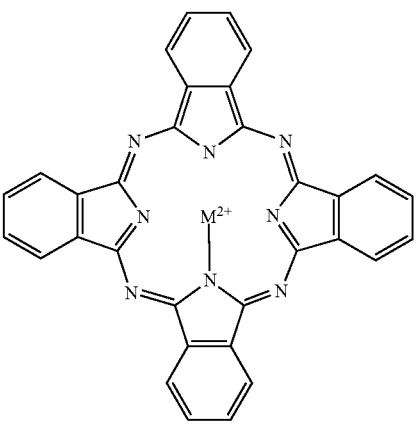

In Chemical Formula 1-1 to Chemical Formula 1-10, M may denote Pt, Pd, Cu, Zn, Sc, Y, La, Ti, Zr, Hf, V, Nb, Ta, Cr, Mo, W, Mn, Tc, Re, Fe, Ru, Os, Co, Rh, Ir, Ni, Ag, Au, Cd, Hg, Al, Ga, In, Tl, Si, Ge, Sn, Pb, P, As, Sb, Bi, S, Se, Te, Po, Cl, Br, I, At, lanthanides, or actinides.

In the present example embodiment, a DAD (donor-acceptor-donor) compound may be Chemical Formula 2, Chemical Formula 3, or Chemical Formula 4, below, but these are examples, and it is not limited thereto. Chemical Formula 3 may be BEDOT-TQMe$_2$ (4,9-bis(2,3-dihydrothieno[3,4-b][1,4]dioxin-5-yl)-6,7-dimethyl-[1,2,5]thiadiazolo[3,4-]quinox aline), and Chemical Formula 4 may be BEDOT-BBT (4,8-bis(2,3-dihydrothieno-[3,4-b][1,4]dioxin-5-yl)benzo[1,2-c;4,5-c']bis[1,2,5]thiadiazole).

Chemical Formula 2

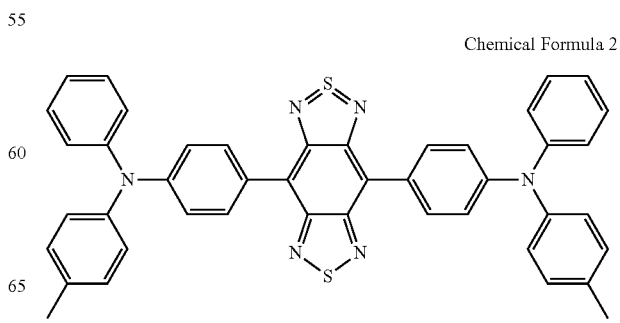

-continued

Chemical Formula 3

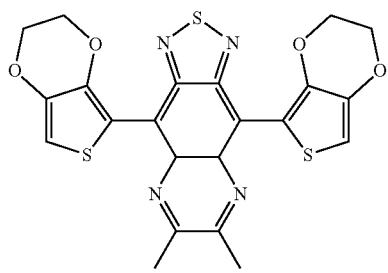

Chemical Formula 4

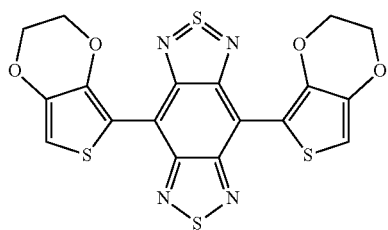

In the present example embodiment, a lanthanide compound may be a compound represented by Chemical Formula 5, Chemical Formula 6, Chemical Formula 7, Chemical Formula 8, or Chemical Formula 9, below, but these are examples and it is not limited thereto.

$$[Z(L)_3]_p M A_q$$ Chemical Formula 5

In Chemical Formula 5,

Z denotes a carbon atom or a fragment of R¹—B, p denotes 1, 2, or 3, q denotes 3-p, A denotes a counterion, R¹ denotes: i) an aryl selectively substituted with hydrogen, an 1 to 5 halogen or an 1C to 8C alkyl group, or an aralkyl group selectively substituted with 1 to 5 halogen or an C1 to C8 alkyl group; or ii) a C1 to C6 alkyl group selectively substituted with at least one halogen element, a C1 to C6 alkenyl group selectively substituted with least one halogen element, or a C1 to C6 alkynyl group selectively substituted with least one halogen element, M denotes a trivalent lanthanide metal ion, such as Tb, Ce, Eu, Er, Gd, Tm, Sm, and Nd, and a plurality of Ls respectively have covalent bonds with Z, and may be selectively selected from Chemical Formula 5-1 and Chemical Formula 5-2.

Chemical Formula 5-1

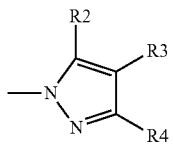

Chemical Formula 5-2

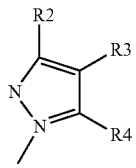

In Chemical Formula 5-1 and Chemical Formula 5-2, R2, R3, and R4 are independently i) a halogen, a cyano group, a nitro group, a sulfone group, an amino group, a C1 to C6 alkylamino group, a C1 to C6 alkylamido group, a carboxyl group, a C1 to C6 alkyloxycarbonyl group, a hydroxy group, a C1 to C6 alkoxy group, a C1 to C6 alkylcarbonyloxy group, a C1 to C6 alkylcarbonyl group, a C1 to C6 haloalkoxy group, or hydrogen, ii) an aryl group or an aralkyl group selectively substituted with one or more of the above-stated groups, or iii) a C1 to C6 alkyl group selectively substituted with one or more of the above-stated groups, a C1 to C6 alkenyl group, or a C1 to C6 alkynyl group.

In another implementation, R2 and R3, or R3 and R4, are connected with each other to form a fused, a directional or a non-directional L-pyrazolyl ring system.

In Chemical Formula 5, an example of $Z(L)_3$ may be represented by Chemical Formula 5-1-1, Chemical Formula 5-2-1, and Chemical Formula 5-2-2, Chemical Formula 5-1-1

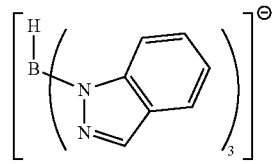

Chemical Formula 5-2-1

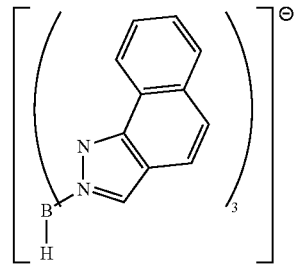

Chemical Formula 5-2-2

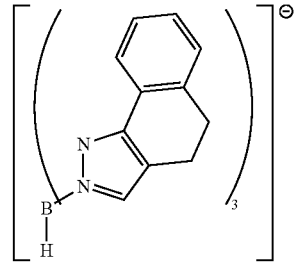

Chemical Formula 6

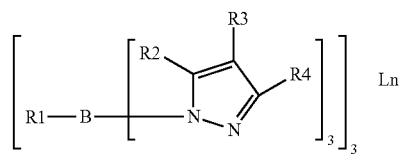

Chemical Formula 7

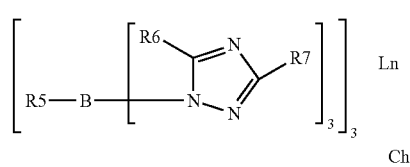

Chemical Formula 8

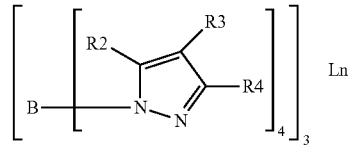

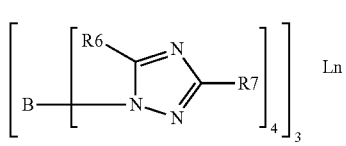

Chemical Formula 9

In Chemical Formula 6 and Chemical Formula 7,

Ln denotes $Ce^{3+}$, $Ce^{4+}$, $Pr^{3+}$, $Pr^{4+}$, $Nd^{3+}$, $Nd^{4+}$, $Prn^{3+}$, $Sm^{3+}$, $Sm^{2+}$, $Eu^{3+}$, $Gd^{3+}$, $Tb^{3+}$, $Tb^{4+}$, $Dy^{3+}$, $Dy^{4+}$, $Er^{3+}$, $Tm^{3+}$, $Tm^{2+}$, $Yb^{3+}$, $Yb^{2+}$, or $Lu^{3+}$, R1 denotes a substituted or unsubstituted pyrazolyl group, a triazolyl group, a hetero aryl group, an alkyl group, an alkoxy group, a phenolate group, an amine group, or an amide group, and R2, R3, R4, R5, R6, and R7 may denote a hydrocarbon group that may include hydrogen, a halogen, or selectively a heteroatom (for example, an alkyl group, an aryl group, or a heteroaryl group). In order to enhance volatility of compounds, R2 to R7 may be fluorinated.

In Chemical Formula 8 and Chemical Formula 9, Ln, R2, R3, R4, R6 and R7 may be as described with reference to Chemical Formula 6 and Chemical Formula 7.

An example of the lanthanide compound may be a compound represented by Chemical Formula 10.

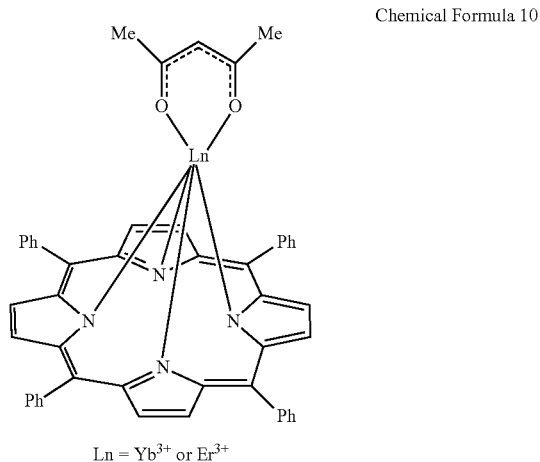

Chemical Formula 10

Ln = $Yb^{3+}$ or $Er^{3+}$

The hole transport layer 130 may be commonly disposed between the red emission layer 150R and the first electrode 12, between the green emission layer 150G and the first electrode 120, between the infrared ray emission layer 145a and the first electrode 120, and between the blue emission layer 150B and the first electrode 120, and a thickness of the hole transport layer 130 may be substantially the same in portions where the hole transport layer 130 is commonly disposed.

The red emission layer 150R may include, for example, a host material that includes carbazole biphenyl (CBP) or mCP (1,3-bis(carbazol-9-yl)), and may be formed of a phosphorescent material including a dopant material including one or more of PIQIr(acac) (bis(1-phenylisoquinoline) acetylacetonate iridium), PQIr(acac) (bis(1-phenylquinoline)acetylacetonate iridium), PQIr (tris(1-phenylquinoline) iridium), or PtOEP (octaethylporphyrin platinum), or, in another implementation, may be formed of a fluorescent material including PBD:Eu(DBM)3(Phen) or perylene, but this is not restrictive.

The green emission layer 150G may include, for example, a host material that includes CBP or mCP, and may be formed of a phosphorescent material including a dopant material including $Ir(ppy)_3$ (fac-tris(2-phenylpyridine) iridium), or, in another implementation, may be formed of a fluorescent material including $Alq_3$ (tris(8-hydroxyquinolino)aluminum), but this is not restrictive.

The blue emission layer 150B may include, for example, a host material including CBP or mCP, and may be formed of a phosphorescent material including a dopant material including $(4,6-F2ppy)_2Irpic$. In another implementation, the blue emission layer 150B may include a host material including an anthracene group, and may be formed of a fluorescent material that includes spiro-DPVBi, spiro-6P, distyrylbenzene (DSB), distyrylarylene (DSA), a PFO-based polymer, or a PPV-based polymer, but it is not limited thereto.

In the present example embodiment, the red emission layer 150R, the green emission layer 150G, and the blue emission layer 150B are made of the organic material, but this is not restrictive. For example, the red emission layer 150R, the green emission layer 150G, and the blue emission layer 150B may be made of an inorganic material such as quantum dots.

Pixel defining layers 25 may be disposed between neighboring layers among the red emission layer 150R, the infrared ray emission layer 145a, the green emission layer 150G, and the blue emission layer 150B.

The electron transport layer 160 and the electron injection layer 180 may be disposed between the emission layer 150 and the second electrode 190. The electron transport layer 160 may be disposed to be adjacent to the emission layer 150 and the infrared ray emission layer 145a, and the electron injection layer 180 may be disposed to be adjacent to the second electrode 190.

The electron transport layer 160 may include an organic material. For example, the electron transport layer 160 may be formed of any one of Alq3 (tris (8-hydroxyquinolino) aluminum), PBD (2-[4-biphenyl-5-[4-tert-butylphenyl]]-1, 3,4-oxadiazole), TAZ (1,2,4-triazole), spiro-PBD (spiro-2-[4-biphenyl-5-[4-tert-butylphenyl]]-1,3,4-oxadiazole), and BAlq (8-hydroxyquinoline beryllium salt), but this is not restrictive.

The electron transport layer 160 may transfer electrons from the second electrode 190 to the emission layer 150. In addition, the electron transport layer 160 may also prevent holes injected from the first electrode 120 from moving to the second electrode 190 through the emission layer 150. Thus, the electron transport layer 160 serves as a hole blocking layer to thereby help combination of holes and electrons in the emission layer 150.

The electron injection layer 180 serves to enhance electron injection into the electron transport layer 160 from the second electrode 190. The electron injection layer 180 may include an ionic compound in which a first component and a second component are combined. Here, the first component is an element that becomes a positive ion when the ionic compound is ionized, and the second component may be an element that becomes a negative ion. In the present example embodiment, the electron injection layer 180 may have a thickness of about 2 Å to about 25 Å in consideration of a process margin.

In the present example embodiment, an auxiliary layer BIL may be disposed below the blue emission layer 150B to enhance efficiency of the blue emission layer 150B. For example, the auxiliary layer BIL may enhance efficiency of the blue emission layer 150B by adjusting a hole charge balance. The auxiliary layer BIL may include, for example, a compound represented by Chemical Formula A, below.

Chemical Formula A

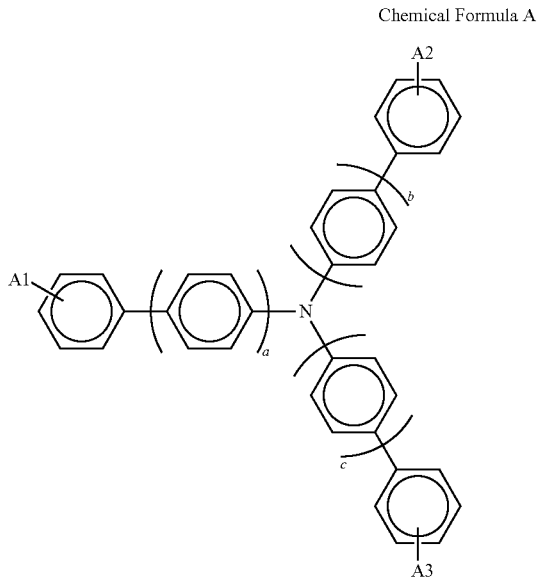

In Chemical Formula A, A1, A2, and A3 may respectively be hydrogen, an alkyl group, an aryl group, carbazole, dibenzothiophene, dibenzofuran (DBF), and biphenyl, and a, b, and c may respectively be integers of 0 to 4.

In the light emitting display device according to the present example embodiment, a red resonance auxiliary layer 145b may be disposed below the red emission layer 150R and a green resonance auxiliary layer 150G' may be disposed below the green emission layer 150G. The red resonance auxiliary layer 145b and the green resonance auxiliary layer 150G' may adjust a resonance distance of each color. In an implementation, an additional resonance auxiliary layer between the blue emission layer 150B and the hole transport layer 130 may not be formed below the blue emission layer 150B and the auxiliary layer BIL.

In the present example embodiment, the infrared ray emission layer 145a and the red resonance auxiliary layer 145b may include the same material. Thus, when the red resonance auxiliary layer 145b is called a first auxiliary layer, the first auxiliary layer may include the same material as the infrared ray emission layer 145a. Thus, the resonance auxiliary layer 145b, which is the first auxiliary layer, may be formed by doping an infrared ray emission dopant to a first pixel light emitting material or a resonance auxiliary layer material like the above-described infrared ray emission layer 145a.

The infrared ray emission layer 145a and the red resonance auxiliary layer 145b may be disposed in the same layer. In order to form such a structure, the infrared ray emission layer 145a and the red resonance auxiliary layer 145b may be formed through the same process. For example, the infrared ray emission layer 145a and the red resonance auxiliary layer 145b may be formed by doping the first pixel light emission material and the resonance auxiliary layer material to areas that respectively correspond to the first pixel R and the infrared ray emission portion IR of FIG. 1, for example, using a thermal evaporation method. The infrared ray emission layer 145a and the red resonance auxiliary layer 145b may be formed through the same process, and the infrared ray emission layer 145a and the red resonance auxiliary layer 145b may be made by using the same mask. The red resonance auxiliary layer 145b and the infrared ray emission layer 145a may be formed between neighboring pixel defining layers 25. As described, according to the present example embodiment, the infrared ray emission layer 145a may be provided in a display device where the plurality of pixels exist, which may simplify a manufacturing process.

Referring to FIG. 1 and FIG. 2, in the present example embodiment, a thickness value acquired by subtracting a thickness of the red emission layer 150R from a secondary resonance thickness value in the first pixel R may be close to a primary resonance thickness in the infrared ray emission portion IR. A thickness acquired by subtracting the thickness of the red emission layer 150R from the secondary resonance thickness of the first pixel R may be about 120% or less relative to the primary resonance thickness in the infrared ray emission portion IR. This will be described in further detail with reference to FIG. 3.

Figure 3:
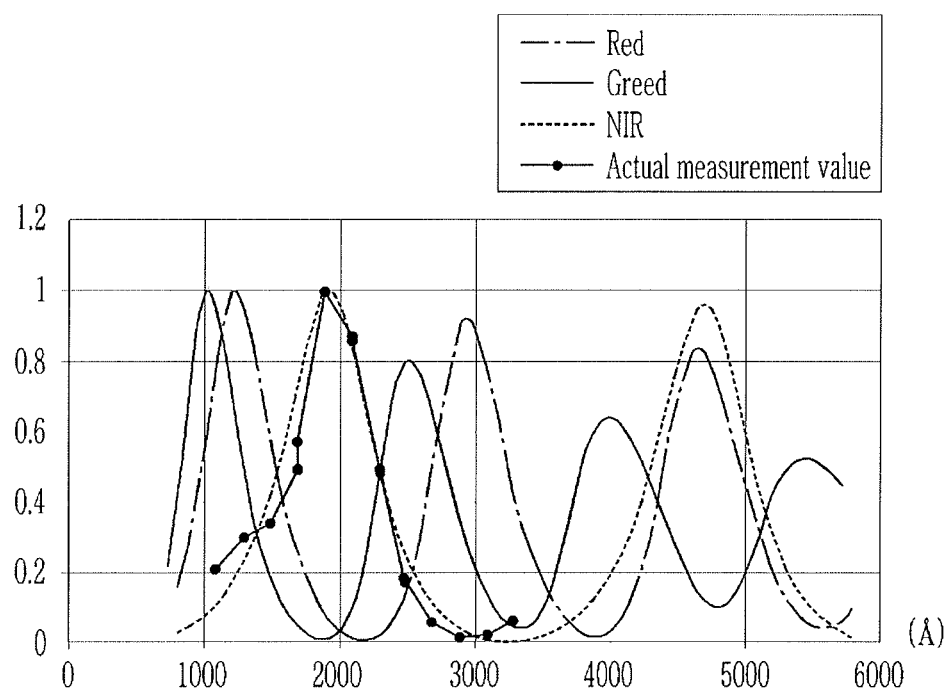
FIG. 3 illustrates a graph of optimized luminous intensity depending on thicknesses in a red pixel, a green pixel, and an infrared ray emission portion.

FIG. 3 is a graph of optimized luminous intensity depending on thicknesses in a red pixel, a green pixel, and an infrared ray emission portion. In FIG. 3, "Red" indicates a red pixel, "Green" indicates a green pixel, and "NIR" indicates an infrared ray emission portion.

Referring to FIG. 3, when a thickness of the emission layer that is located in the red pixel is subtracted from the secondary resonance thickness (i.e., a thickness corresponding to the second peak) of the red pixel, a result of the subtraction may be close to the primary resonance thickness (i.e., a thickness corresponding to the first peak) of the infrared ray emission portion. Accordingly, deterioration of infrared ray luminous efficiency may be minimized.

As described above, in an embodiment the red resonance auxiliary layer 145b includes the same material as the infrared ray emission layer 145a and is disposed in the same layer as the infrared ray emission layer 145a, but according to an example variation, instead of the red resonance auxiliary layer 145b, a green resonance auxiliary layer 150G' is modified to include the same material as the infrared ray emission layer 145a and disposed in the same layer as the infrared ray emission layer 145a in the light emitting display device.

In the example embodiment illustrated in FIG. 2, the electron injection layer 180 and the second electrode 190 are commonly disposed between the red emission layer 150R and the capping layer 200, between the green emission layer 150G and the capping layer 200, and between the blue emission layer 150B and the capping layer 200, and a thickness of the electron injection layer 180 and a thickness of the second electrode 190 may be substantially the same in a portion where the electron injection layer 180 and the second electrode 190 are commonly disposed.

Figure 4:
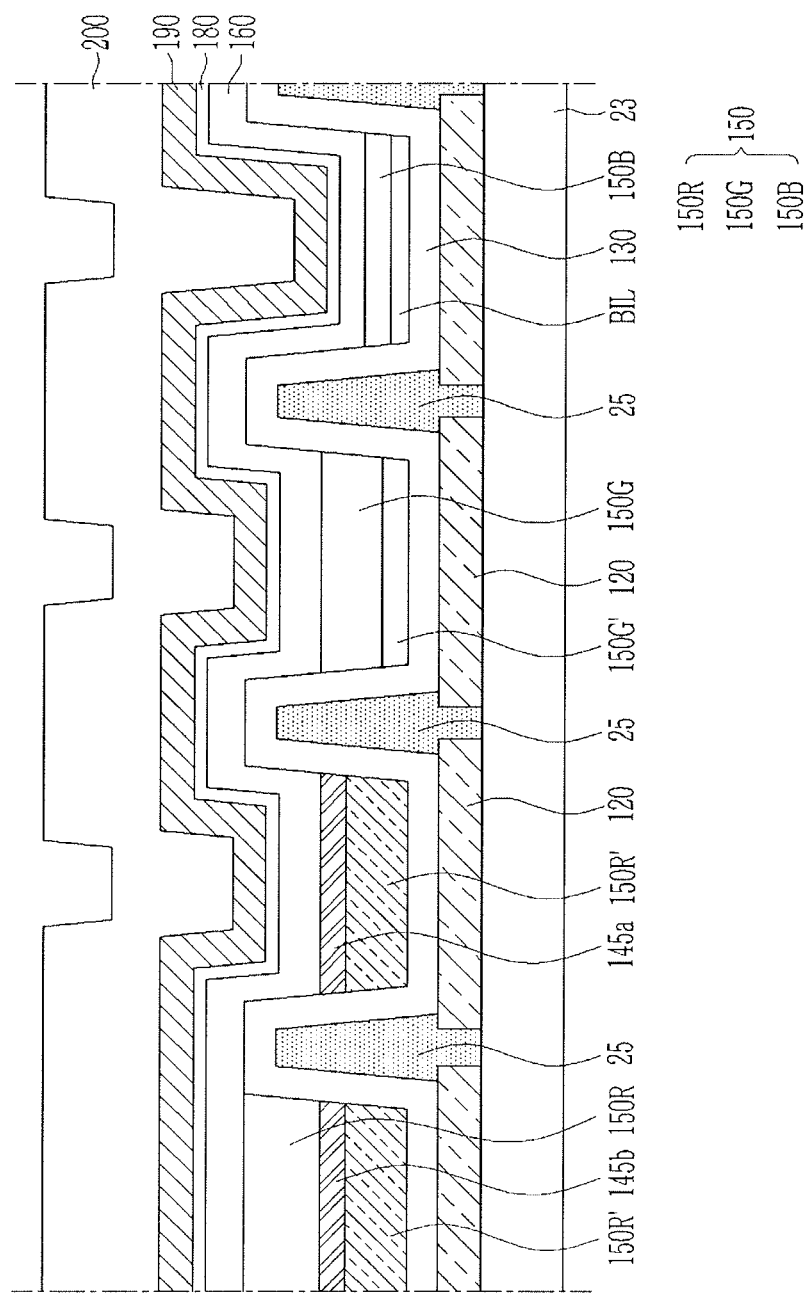
FIG. 4 illustrates a cross-sectional view of an example variation of the structure of the infrared ray emission portion of FIG. 2.

FIG. 4 is a cross-sectional view of an example variation of the structure of the infrared ray emission portion of the example embodiment of FIG. 2. Hereinafter, only a portion that is different from the example embodiment of FIG. 2 will be described, and the contents described with reference to FIG. 2 can be applied to the example embodiment of FIG. 4.

In the example embodiment illustrated in FIG. 4, additional red resonance layers 150R' are disposed between the infrared ray emission layer 145a and the hole transport layer 130 and between the red resonance auxiliary layer 145b and the hole transport layer 130. Unlike the red resonance auxiliary layer 145b, the additional red resonance auxiliary layer 150R' is not doped with an infrared ray emission dopant and may include only the first pixel emitting material or the resonance auxiliary layer material. Thus, when the red resonance auxiliary layer 145b disposed in the first pixel R of FIG. 1 is called a first auxiliary layer, the additional red resonance auxiliary layer 150R' disposed in the infrared ray emission portion IR of FIG. 1 is called a second auxiliary layer, and the additional red resonance auxiliary layer 150R' disposed between the infrared ray emission layer 145a and the hole transport layer 130 is called a third auxiliary layer, the second auxiliary layer and the third auxiliary layer are equally the additional red resonance auxiliary layer 150R'. Thus, the second auxiliary layer and the third auxiliary layer may be made of the same material and may be disposed in the same layer. In this case, the second auxiliary layer may be thicker than the first auxiliary layer. Here, a thickness of the first auxiliary layer disposed on the second auxiliary layer may be about 10% to 20% of a thickness of the red resonance auxiliary layer 145b shown in the example embodiment of FIG. 2.

In the present example embodiment, when the additional red resonance auxiliary layer 150R' and the red resonance auxiliary layer 145b are stacked in the first pixel R of FIG. 1, a hole trap due to the infrared ray emission dopant may be reduced so that a driving voltage may be reduced and luminous efficiency may be improved. This will be described in further detail with reference to FIG. 5.

Figure 5:
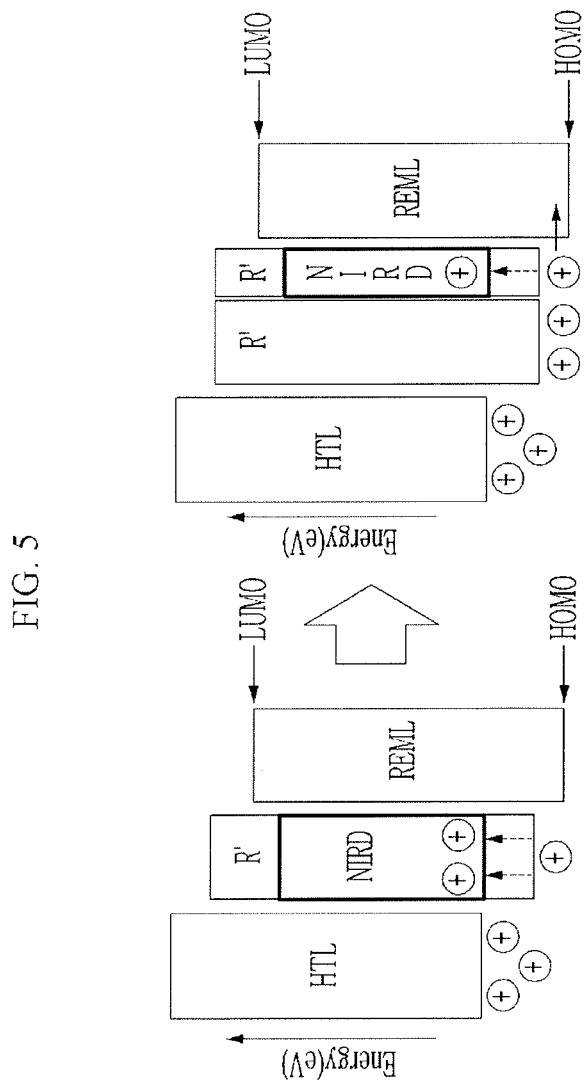
FIG. 5 illustrates a schematic view illustrating energy level of each layer of the light emitting element included in the light emitting display device according to the example embodiment of FIG. 4.

FIG. 5 illustrates a schematic view of energy levels of each layer of the light emitting element included in the light emitting display device according to the example embodiment of FIG. 4.

Referring to FIG. 5, as shown in the left energy level graph, an energy level of the auxiliary layer R' disposed between the red emission layer REML and the hole transport layer HTL is lower than a HOMO energy level of the infrared ray emission dopant NIRD. Thus, holes (+) passed through the auxiliary layer R so as to be injected into the red emission layer REML may be trapped in the auxiliary layer R'. However, when the auxiliary layer is provided as the stacked structure as shown in FIG. 4, a trapping level of the auxiliary layer doped with the infrared ray emission doped is reduced through injection of the additional red resonance auxiliary layer R' such that a driving voltage can be reduced and luminous efficiency can be improved.

Referring back to FIG. 4, similar to the manufacturing method described with reference to FIG. 2, a process for forming the first pixel R of FIG. 1 and a process for forming the infrared ray emission portion IR of FIG. 1 may be performed simultaneously to form the light emitting element structure according to the present example embodiment. Thus, the additional red resonance auxiliary layer 150R' may be formed in an area that corresponds to the first pixel R and the infrared ray emission portion IS, and the red resonance auxiliary layer 145b and the infrared ray emission layer 145a may be formed without changing a mask.

Figure 6:
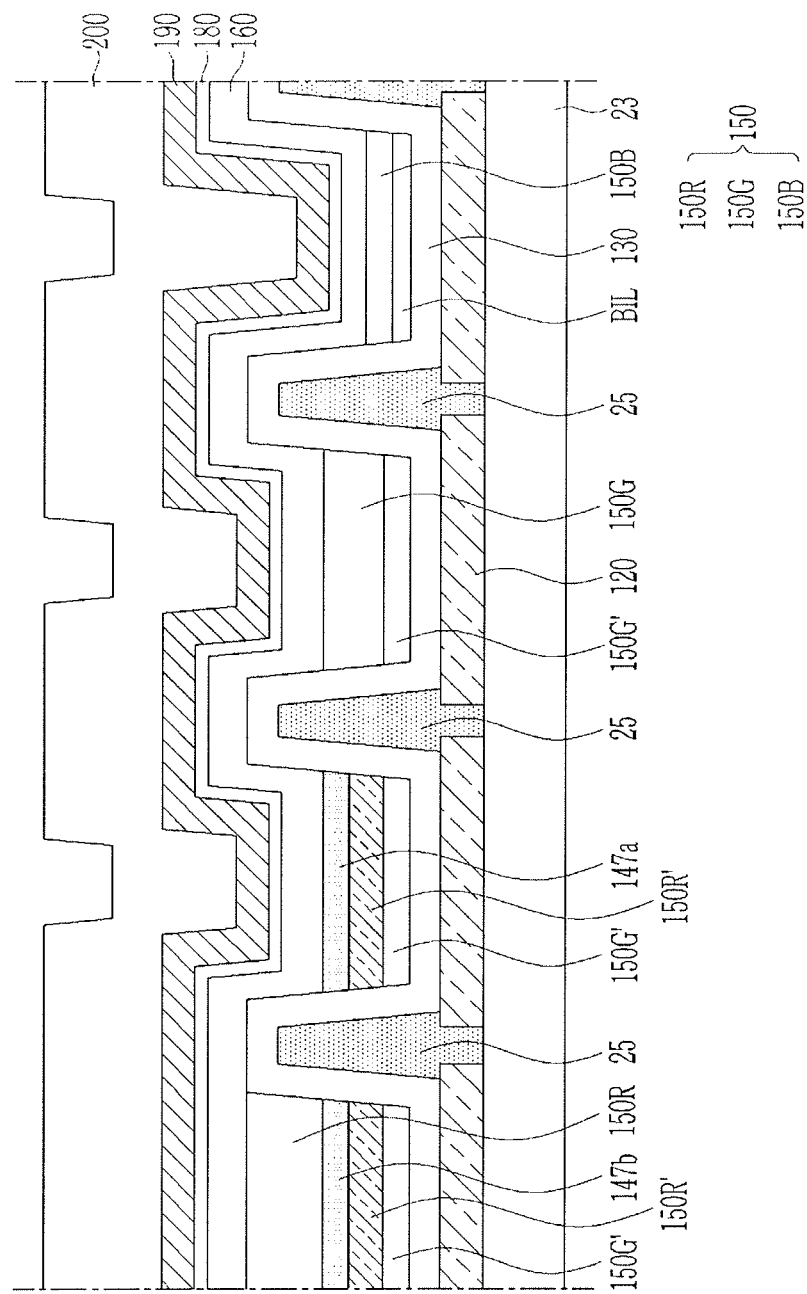
FIG. 6 illustrates a cross-sectional view of an example variation of the structure of the infrared ray emission portion of FIG. 4.

FIG. 6 illustrates a cross-sectional view of an example variation of the structure of the infrared ray emission portion of FIG. 4. Hereinafter, a portion that is different from the example embodiment of FIG. 1 will be described, and the contents described with reference to FIG. 1 can be applied to the example embodiment of FIG. 6.

In the example embodiment illustrated in FIG. 6, a green resonance auxiliary layer 150G' is disposed between an additional red resonance layer 150R' and a hole transport layer 130. Thus, when the green resonance auxiliary layer 150G' disposed in the second pixel G of FIG. 1 is called a fourth auxiliary layer, the green resonance auxiliary layer 150G' disposed in the first pixel R of FIG. 1 is called a fifth auxiliary layer, and the green resonance auxiliary layer 150G' disposed in the infrared ray emission portion IR of FIG. 1 is called a sixth auxiliary layer, the fourth auxiliary layer, the fifth auxiliary layer, and the fifth auxiliary layer may include the same material and may be disposed in the same layer. In an example embodiment, with the fourth auxiliary layer, the fifth auxiliary layer, and the sixth auxiliary layer being disposed in the same layer, the fourth auxiliary layer, the fifth auxiliary layer, and the sixth auxiliary layer are formed through the same process.

An infrared ray emission layer 147a may be disposed on the additional red resonance auxiliary layer 150R', and a red resonance auxiliary layer 147b may be disposed between the red emission layer 150R and the red resonance auxiliary layer 150W. In the present example embodiment, an infrared ray emission dopant may be doped to an infrared ray emission host in the infrared ray emission layer 147a and the red resonance auxiliary layer 147b.

In order to form a stacking structure of the additional red resonance auxiliary layer 150R' that includes only the first pixel emission material or the resonance auxiliary layer material of the example embodiment of FIG. 4 and the red resonance auxiliary layer 145b of which the infrared ray emission dopant is doped to the first pixel emission material or the resonance auxiliary layer material, more than three sources may be required for each chamber. In the current state of the art, where a deposition thickness per source is limited, one source may not ensure a thickness of the additional red resonance auxiliary layer 150R' and therefore a material of the red resonance auxiliary layer 145b may be the same as the material of the additional red resonance auxiliary layer 150R'. However, in the present example embodiment, the green resonance auxiliary layer 150G' may be commonly deposited in the first pixel R and the infrared ray emission portion IR of FIG. 1, and thus a deposition thickness of the additional red resonance auxiliary layer 150R' may be reduced, thereby varying a selection range of a host material of the infrared ray emission layer 147a and the red resonance auxiliary layer 147b.

Figure 7:
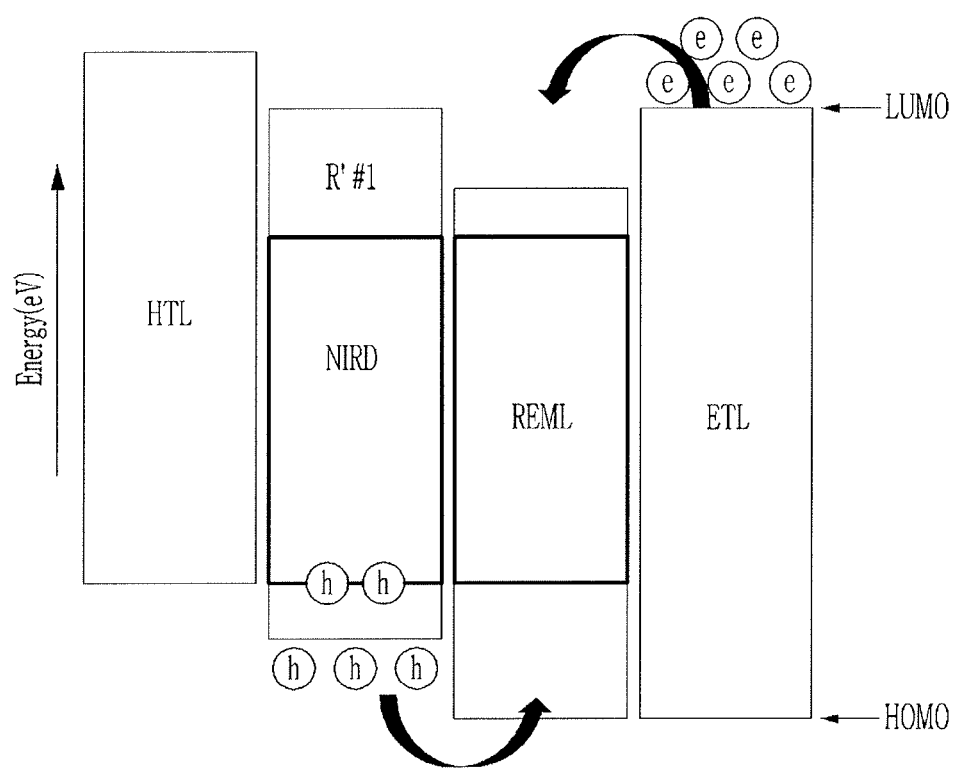
FIG. 7 illustrates a schematic diagram of an energy level of each layer of the light emitting element included in the light emitting display device according to the example embodiment of FIG. 2.
Figure 8:
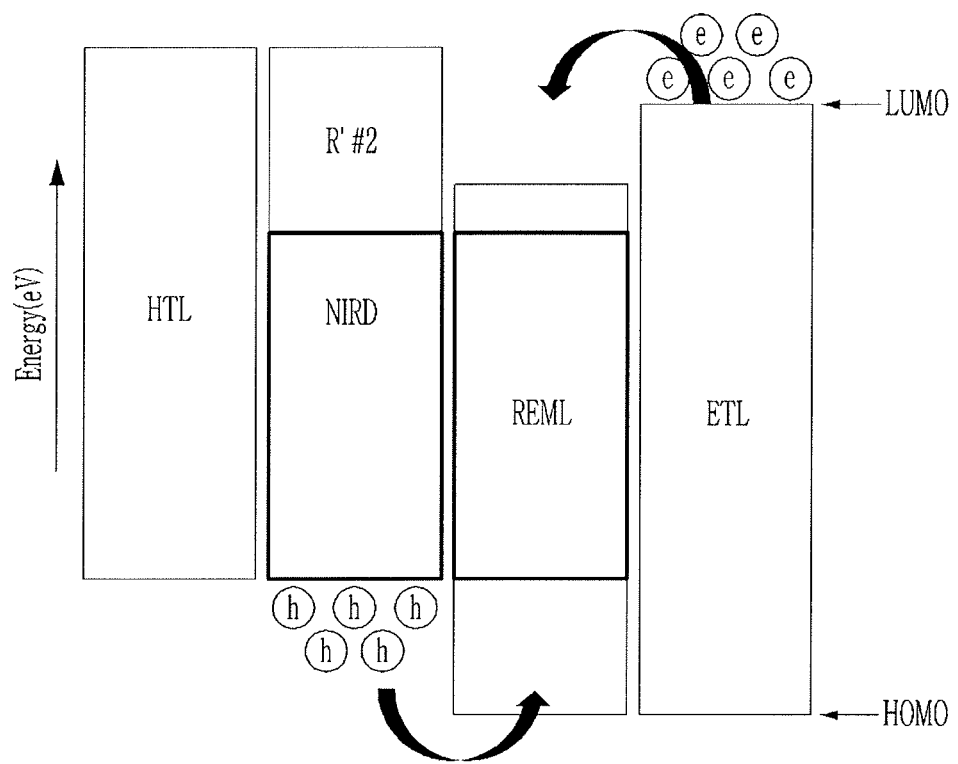
FIG. 8 illustrates an energy level of each layer of the light emitting element in which a HOMO energy level of the auxiliary layer doped with the infrared ray emission dopant is adjusted according to an example embodiment.

FIG. 7 illustrates a schematic diagram of an energy level of each layer of the light emitting element included in the light emitting display device according to the example embodiment of FIG. 2. FIG. 8 schematically shows an energy level of each layer of the light emitting element in which a HOMO energy level of the auxiliary layer doped with the infrared ray emission dopant is adjusted according to an example embodiment.

Referring to FIG. 7, for sufficient hole injection, the HOMO energy level of the hole transport layer (HTL)—auxiliary layer R' #1—emission layer REML may be formed stepwise. For infrared ray emission, a HOMO energy level of the infrared ray emission dopant NIRD doped to the auxiliary layer R' #1 is higher than a HOMO energy level of the auxiliary layer R' #1 that is disposed between the red emission layer REML and the hole transport layer HTL. Thus, holes h passed through the auxiliary layer R' #1 so as to be injected to the red emission layer REML may be trapped in the auxiliary layer R' #1, which may cause an increase of a driving voltage and deterioration of luminous efficiency.

Referring to FIG. 8, in a light emitting element according to the present example embodiment, a HOMO energy level of an auxiliary layer R' #2 where an infrared ray emission dopant NIRD is doped may be adjusted to be similar to a HOMO energy level of a hole transport layer HTL or the infrared ray emission dopant NIRD. In this case, a gap between the HOMO energy level of the auxiliary layer R' #2 and the HOMO energy level of the infrared ray emission dopant NIRD or between the HOMO energy level of the auxiliary layer R' #2 and the HOMO energy level of the hole transport layer HTL may be about 0.3 eV or less. According to the present example embodiment, a hole trap due to the infrared ray emission dopant NIRD may be prevented, thereby minimizing a driving voltage increase and deterioration of luminous efficiency.

When the HOMO energy level of the auxiliary layer R' #2 doped with the infrared ray emission dopant NIRD is adjusted to be similar to the HOMO energy level of the hole transport layer or the infrared ray emission dopant NIRD, a gap between a HOMO energy level of an emission layer and the HOMO energy level of the auxiliary layer R' #2 doped with the infrared ray emission dopant NIRD may be increased. However, effects caused by such a gap may be much less than the driving voltage increase and the deterioration of luminous efficiency caused by the hole trap, which has been described with reference to FIG. 7.

Figure 9:
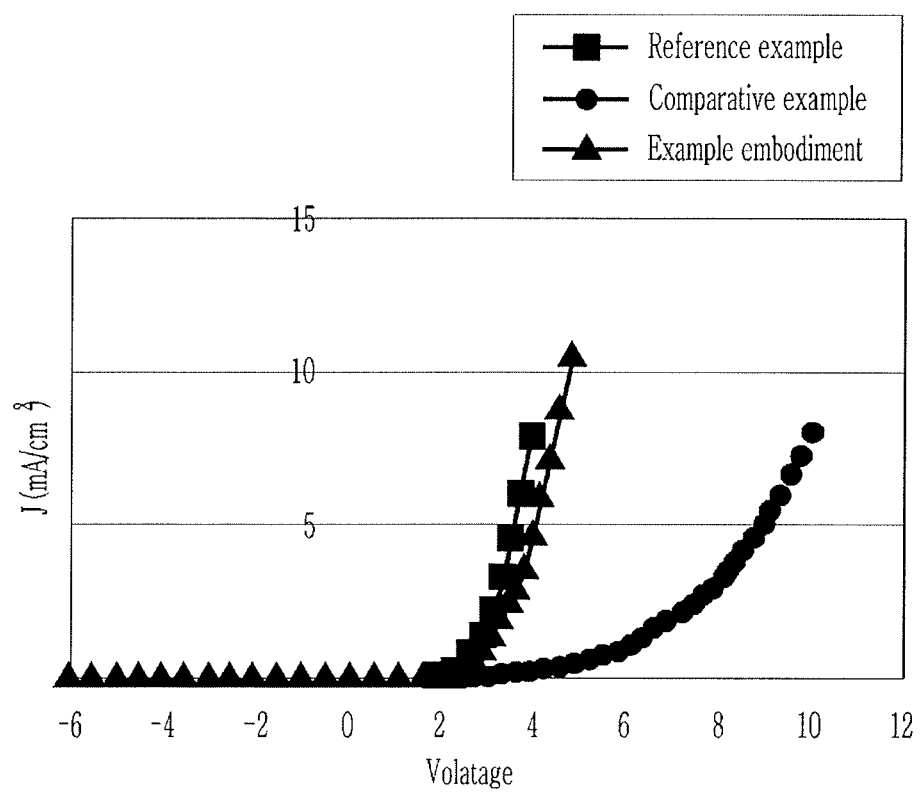
FIG. 9 illustrates a graph that shows a result of comparison of current intensity depending on voltages in the light emitting display device according to the example embodiment FIG. 6 with a reference example and a comparative example.

Hereinafter, an effect of an example embodiment will be described with reference to Table 1 and FIG. 9. FIG. 9 illustrates a graph that shows a result of comparison of current intensity depending on voltages of an example embodiment with a reference example and a comparative example.

Here, the reference example is a light emitting element that includes an auxiliary layer that is formed by only a red resonance auxiliary layer material, the comparative example is a light emitting element that includes an auxiliary layer in which an infrared ray emission dopant is doped to a red resonance auxiliary layer material, and the example embodiment is the light emitting element of FIG. 8.

TABLE 1

|  | Driving voltage (V) | Red color coordinate | Luminous efficiency (Cd/A) |
| --- | --- | --- | --- |
| Reference Example | 3.9 | 0.653 | 54.5 |
| Comparative Example | 10.0 | 0.656 | 39.9 |
| Example Embodiment | 4.6 | 0.662 | 42.3 |

Referring to Table 1 and FIG. 9, compared to the reference example, a driving voltage is increased by 6.1 V and luminous efficiency is deteriorated by 27% in the comparative example, but a driving voltage is decreased by 5.4 V and luminous efficiency is improved by 6% in the example embodiment compared to the comparative example.

Figure 10:
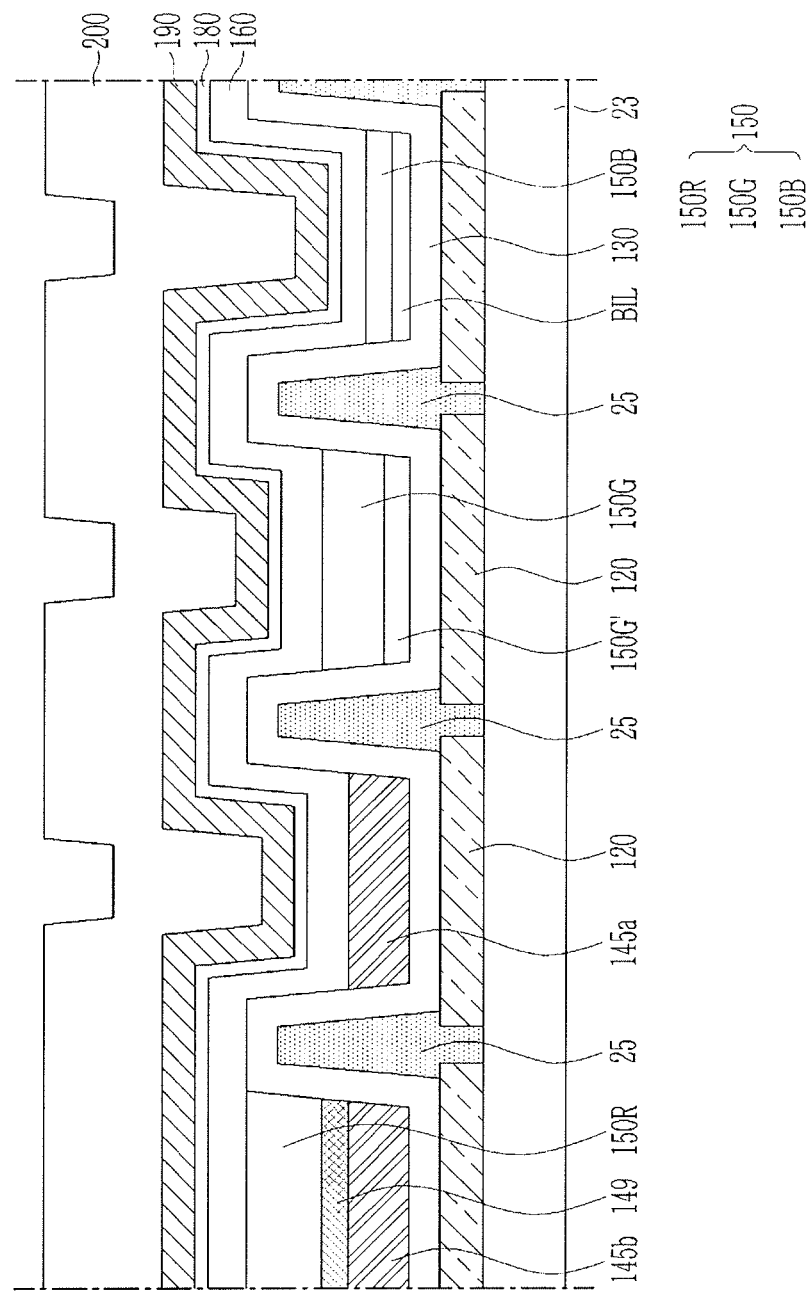
FIG. 10 illustrates a cross-sectional view of an example variation of the red pixel structure of the example embodiment of FIG. 2.
Figure 11:
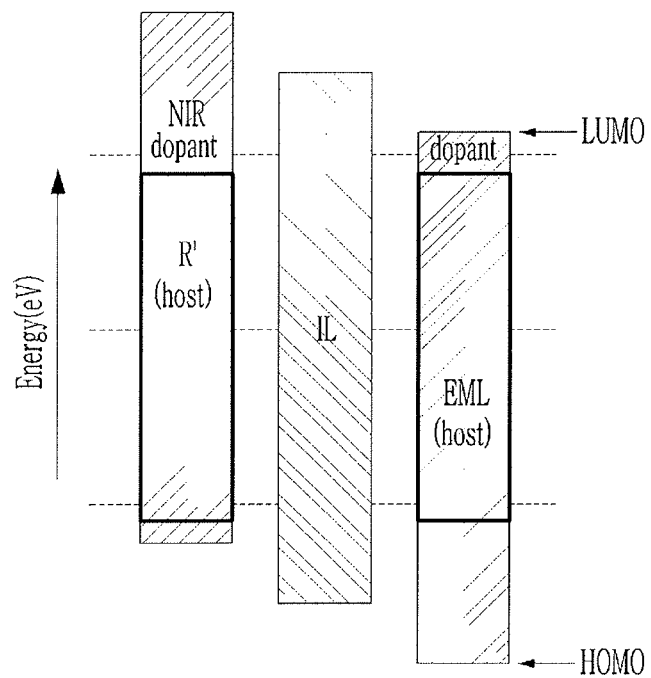
FIG. 11 illustrates a schematic view of an energy level of each layer of a light emitting element included in a light emitting display device according to the example embodiment of FIG. 10.

FIG. 10 illustrates a cross-sectional view of an example variation of the red pixel structure of the example embodiment of FIG. 2. FIG. 11 illustrates a schematic view of an energy level of each layer of a light emitting element included in a light emitting display device according to the example embodiment of FIG. 10. Hereinafter, only a portion that is different from the example embodiment of FIG. 2 will be described, and the content described with reference to FIG. 2 can be applied to the example embodiment of FIG. 10.

In the example embodiment illustrated in FIG. 10, an intermediate layer 149 is disposed between a red emission layer 150R and a red resonance auxiliary layer 145b in an area that corresponds to the first pixel R of FIG. 1. Referring to FIG. 11, a HOMO energy level of an intermediate layer IL is between the HOMO energy level of the red resonance auxiliary layer and the HOMO energy level of a emission layer, and a stepwise barrier layer structure is formed by the intermediate layer 149 of the present example embodiment.

The red resonance auxiliary layer 145b may adjust a resonance distance in the red pixel and serve as an emission layer in the red infrared emission element, and therefore, in the red resonance auxiliary layer 145b, an infrared ray dopant may be doped to a red emission host material. Here, the red emission host material may be, for example, a metal complex compound including carbazole. In this case, a HOMO energy level of the red emission host material including the metal complex compound may be 5.3 eV or less, and a gap between a HOMO energy level of the infrared ray emission dopant and the HOMO energy level of the red emission host material may be within about 0.3 eV.

When the light emitting element including the red resonance auxiliary layer where the infrared ray emission dopant is doped to the red emission host material is Example Embodiment 1 in Table 2, a driving voltage is decreased by 2.3 V and luminous efficiency is improved by 80% in Example Embodiment 1 compared to Comparative Example 1 in which an infrared ray emission dopant is doped to a hole transport layer material that is used as a material of a red resonance auxiliary layer. Table 2 shows experiment results of a driving voltage, luminous efficiency, and color coordinates of an element formed in an infrared ray emission portion.

TABLE 2

| Element structure | Driving voltage (V) | Luminous efficiency (Cd/A) | Red color coordinate | Green color coordinate |
| --- | --- | --- | --- | --- |
| Comparative Example 1 | 6.1 | 3.8 | 0.675 | 0.311 |
| Example Embodiment 1 | 3.8 | 21.4 | 0.685 | 0.315 |

In Table 3, Comparative Example 2 is a case that a red auxiliary layer is formed of only a hole transport layer material without doping an infrared ray emission dopant, and Table 3 shows an experiment result of a driving voltage, luminous efficiency, and color coordinates of a red emission element.

Referring to Table 3, the red emission element that includes the red resonance auxiliary layer in which the infrared ray emission dopant is doped to the red emission host material has a luminous efficiency that is about 20% decreased compared to Comparative Example 2. Without being bound by theory, such a result may show that a recombination zone of holes and electrodes is formed not in an emission layer but in an auxiliary layer, and this may be caused by hole trap due to the infrared ray emission dopant.

TABLE 3

| Element Structure | Driving voltage (V) | Luminous efficiency (Cd/A) | Red color coordinate | Green color coordinate |
| --- | --- | --- | --- | --- |
| Comparative Example 2 | 4.0 | 54.5 | 0.662 | 0.338 |
| Example Embodiment 1 | 4.7 | 42.6 | 0.676 | 0.324 |

In the present example embodiment, the light emitting display device of FIG. 10 includes the intermediate layer 149. The recombination zone may be formed in a red emission layer 150R, and the intermediate layer 149 may serve to block electrons while easing hole transport.

Figure 12:
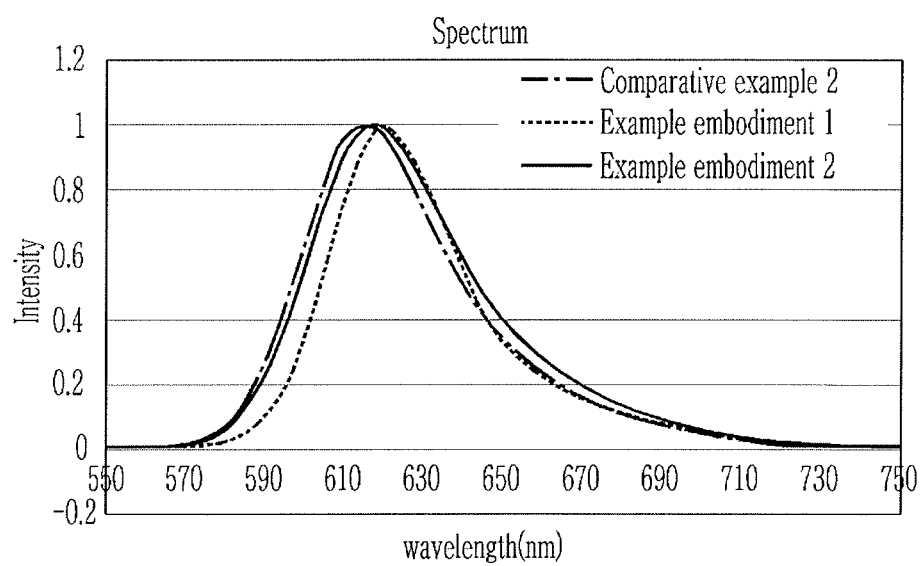
FIG. 12 illustrates a graph that shows luminance intensity according to wavelengths in the light emitting display device according to the example embodiment of FIG. 10.

FIG. 12 illustrates a graph that shows luminance intensity according to wavelengths in the light emitting display device according to the example embodiment of FIG. 10. Table 4 shows experiment results of a driving voltage, luminous efficiency, and color coordinates of Comparative Example 2 and Experiment Example 1 of Table 2 and Table 3 and a light emitting element that includes the intermediate layer 149 of FIG. 10.

Referring to FIG. 12 and Table 4, the luminous efficiency of Example Embodiment 2 is decreased by about 5% compared to Comparative Example 2, but is increased by about 20% compared to Example Embodiment 1, and therefore an element characteristic may be additionally improved by changing a material.

TABLE 4

| Element structure | Driving voltage (V) | Luminous efficiency (Cd/A) | Red color coordinate | Green color coordinate |
|---|---|---|---|---|
| Comparative Example 2 | 4.0 | 54.5 | 0.662 | 0.338 |
| Example Embodiment 1 | 4.7 | 42.6 | 0.676 | 0.338 |
| Example Embodiment 2 | 4.8 | 51.2 | 0.661 | 0.339 |

Figure 13:
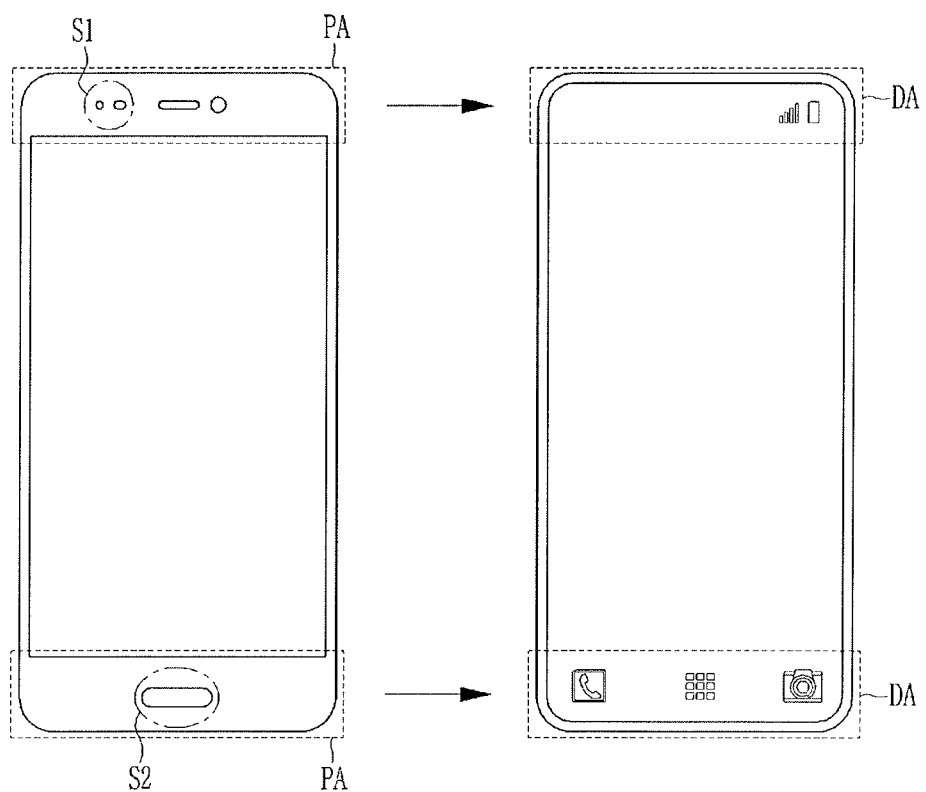
FIG. 13 illustrates a comparative device and a light emitting display device in which an infrared ray emission portion is formed according to an example embodiment.

FIG. 13 schematically shows a comparative example (a) and a light emitting display device in which an infrared ray emission portion is formed according to an example embodiment (b).

In FIG. 13, the left side device (a) is a light emitting display device where a first sensor S1 and a second sensor S2 are formed in a peripheral area PA. In this case, the first sensor S1 may serve as a proximity sensor and the second sensor S2 may serve as a fingerprint sensor with application of a physical button. In such a light emitting display device, an additional sensor module is manufactured to be applied to the light emitting display device, thereby causing complexity in the manufacturing process.

In FIG. 13, the right side device (b) is a light emitting display device where a display area DA extends to an outer edge. When the layouts of the pixels and the infrared ray sensor according to the above-described example embodiments are used, the physical button may be removed as shown in the right side device (b) of FIG. 13 so that a light emitting display device that is capable of displaying a full front side thereof can be implemented.

By way of summation and review, an additional sensor module may be used to implement a sensor in a light emitting display device that includes such a light emitting element. The additional sensor module may require an additional process and extra cost.

As described above, embodiments may provide a light emitting display device that includes an infrared ray emitting element formed in a panel. The infrared ray emitting element may be disposed in the panel together with the pixels of the light emitting element, and a manufacturing process of the light emitting display device may be simplified. Further, a fingerprint sensor may replace a physical button in the light emitting display device, which may increase the area of the display area.

<Description of symbols>

R: first pixel    G: second pixel    B: third pixel
IR: infrared ray emission portion
149: intermediate layer
150: emission layer Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light emitting display device, comprising:
a substrate;
a first pixel, a second pixel, a third pixel, and an infrared ray emission portion on the substrate, the first pixel, the second pixel, and the third pixel representing different colors;
a first electrode on the substrate;
a second electrode that overlaps the first electrode;
an emission layer between the first electrode and the second electrode;
a hole transport layer disposed between the first electrode and the emission layer; and
an auxiliary layer between the hole transport layer and the emission layer,
wherein the emission layer includes a first emission layer in the first pixel and an infrared ray emission layer in the infrared ray emission portion,
wherein the auxiliary layer includes a first auxiliary layer in the first pixel,
wherein the infrared ray emission layer and the first auxiliary layer include the same material,
wherein the infrared ray emission portion is between two of the first pixel, the second pixel, and the third pixel in a plan view, and
wherein the infrared ray emission layer and the first auxiliary layer are not disposed in the second pixel and the third pixel.

2. The light emitting display device as claimed in claim 1, wherein the infrared ray emission layer and the first auxiliary layer are disposed in the same layer.

3. The light emitting display device as claimed in claim 2, wherein the first emission layer is provided on the first auxiliary layer.

4. The light emitting display device as claimed in claim 1, further comprising: a second auxiliary layer between the first electrode and the first auxiliary layer; and a third auxiliary layer between the first electrode and the infrared ray emission layer, wherein the second auxiliary layer and the third auxiliary layer include the same material.

5. The light emitting display device as claimed in claim 4, wherein the second auxiliary layer and the third auxiliary layer are disposed in the same layer.

6. The light emitting display device as claimed in claim 5, wherein the second auxiliary layer and the third auxiliary layer include the same resonance auxiliary layer material.

7. The light emitting display device as claimed in claim 4, wherein the second auxiliary layer is thicker than the first auxiliary layer.

8. The light emitting display device as claimed in claim 4, wherein, in the infrared ray emission layer and the first auxiliary layer, an infrared ray emission dopant is doped to a first pixel emission material or a resonance auxiliary layer material.

9. The light emitting display device as claimed in claim 4, wherein:
the emission layer further includes a second emission layer in the second pixel, the auxiliary layer further includes a fourth auxiliary layer in the second pixel, a fifth auxiliary layer in the first pixel, and a sixth auxiliary layer in the infrared ray emission portion, and the fourth auxiliary layer, the fifth auxiliary layer, and the sixth auxiliary layer include the same material.

10. The light emitting display device as claimed in claim 9, wherein the fourth auxiliary layer, the fifth auxiliary layer, and the sixth auxiliary layer are in the same layer.

11. The light emitting display device as claimed in claim 9, wherein, in the infrared ray emission layer and the first auxiliary layer, an infrared ray emission dopant is doped to an infrared ray emission host.

12. The light emitting display device as claimed in claim 11, wherein the infrared ray emission dopant includes one or more of a metal complex compound, a donor-acceptor-donor compound, or a lanthanide compound.

13. The light emitting display device as claimed in claim 12, wherein a metal included in the metal complex compound includes Pt, Pd, Cu, or Zn.

14. The light emitting display device as claimed in claim 1, wherein the first pixel, the second pixel, and the third pixel respectively correspond to a red pixel, a green pixel, and a blue pixel, and the first auxiliary layer of the first pixel is disposed in the same layer as the infrared ray emission layer.

15. The light emitting display device as claimed in claim 1, further comprising an intermediate layer between the first emission layer and the first auxiliary layer.

16. The light emitting display device as claimed in claim 15, wherein a HOMO energy level of the intermediate layer is between a HOMO energy level of the first auxiliary layer and a HOMO energy level of the first emission layer.

17. The light emitting display device as claimed in claim 16, wherein the HOMO energy level of the intermediate layer is lower than that of the first auxiliary layer.

18. The light emitting display device as claimed in claim 1, wherein a gap between a HOMO energy level of the first auxiliary layer and a HOMO energy level of an infrared ray emission dopant is 0.3 eV or less.

19. A light emitting display device, comprising:
a substrate;
a first pixel, a second pixel, a third pixel, and an infrared ray emission portion on the substrate, the first pixel, the second pixel, and the third pixel representing different colors;
a first electrode on the substrate;
a second electrode that overlaps the first electrode;
an emission layer between the first electrode and the second electrode; and
an auxiliary layer between the first electrode and the emission layer,
wherein the emission layer includes a first emission layer in the first pixel and an infrared ray emission layer in the infrared ray emission portion,
wherein the auxiliary layer includes a first auxiliary layer in the first pixel, wherein the infrared ray emission layer and the first auxiliary layer include the same material,
wherein the infrared ray emission layer and the first auxiliary layer comprise an infrared ray emission dopant in a first pixel emission material or a resonance auxiliary layer material, and
wherein the infrared ray emission layer and the first auxiliary layer are not disposed in the second pixel and the third pixel.

20. The light emitting display device as claimed in claim 19, wherein the infrared ray emission dopant includes one or more of a metal complex compound, a donor-acceptor-donor compound, or a lanthanide compound.

21. The light emitting display device as claimed in claim 20, wherein a metal included in the metal complex compound includes Pt, Pd, Cu, or Zn.

22. The light emitting display device as claimed in claim 21, wherein the metal complex compound includes a compound represented by Chemical Formula 1:

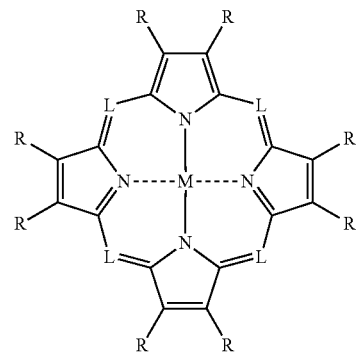

Chemical Formula 1 wherein, in Chemical Formula 1,
L is N or CR' where R' is a phenyl group, a tolyl group, a xylenyl group, a mesityl group, a methyl group, an ethyl group, an n-propyl group, or an isopropyl group,
M is Pt, Pd, Cu, Zn, Sc, Y, La, Ti, Zr, Hf, V, Nb, Ta, Cr, Mo, W, Mn, Tc, Re, Fe, Ru, Os, Co, Rh, Ir, Ni, Ag, Au, Cd, Hg, Al, Ga, In, Tl, Si, Ge, Sn, Pb, P, As, Sb, Bi, S, Se, Te, Po, Cl, Br, I, At, a lanthanide, or an actinide, and
each R is independently Cl, Br, I, At, or a group that includes an atom coupled to a beta (β) carbon of a pyrrole ring, wherein the atom coupled to the beta (β) carbon is B, C, N, O, Si, P, S, Cl, Ge, As, Se, Br, In, Sn, Sb, Te, I, Ti, Pb, Bi, Po, or At, and two adjacent R groups coupled to the same pyrrole ring optionally form a carbocyclic group or a heterocyclic group together with two β carbons.

23. The light emitting display device as claimed in claim 22, wherein a light emission of the infrared ray emission dopant has a wavelength range of 700 nanometers to 1000 nanometers.

* * * * *